(12) United States Patent
Chen et al.

(10) Patent No.: US 9,735,763 B1
(45) Date of Patent: Aug. 15, 2017

(54) HIGH VOLTAGE INPUT RECEIVER USING LOW-VOLTAGE DEVICES

(71) Applicant: QUALCOMM Incorporated, San Diego, CA (US)

(72) Inventors: Wilson Chen, San Diego, CA (US); Chiew-Guan Tan, San Diego, CA (US); Sumit Rao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/083,030

(22) Filed: Mar. 28, 2016

(51) Int. Cl.
- *H03K 5/08* (2006.01)
- *H03K 19/003* (2006.01)
- *H03K 5/24* (2006.01)

(52) U.S. Cl.
CPC .............. *H03K 5/08* (2013.01); *H03K 5/24* (2013.01); *H03K 19/00315* (2013.01)

(58) Field of Classification Search
CPC ....... H03K 5/08; H03K 5/24; H03K 19/00315
USPC ............... 327/309, 318, 319, 327, 328, 333
See application file for complete search history.

(56) References Cited

U.S. PATENT DOCUMENTS

| | | | |
|---|---|---|---|
| 5,966,026 A | 10/1999 | Partovi et al. | |
| 6,323,704 B1 * | 11/2001 | Pelley | H03K 19/00315 327/112 |
| 6,525,607 B1 | 2/2003 | Liu | |
| 6,577,163 B1 | 6/2003 | Waldrip et al. | |
| 6,650,167 B1 | 11/2003 | Benzer et al. | |
| 6,819,137 B1 | 11/2004 | Wang et al. | |
| 6,879,198 B2 | 4/2005 | Kumar et al. | |
| 7,804,334 B2 | 9/2010 | Shankar et al. | |
| 7,884,646 B1 | 2/2011 | Bourstein | |
| 8,482,329 B2 | 7/2013 | Deshpande et al. | |
| 8,680,891 B2 | 3/2014 | Srivastava et al. | |
| 8,767,841 B1 | 7/2014 | Li et al. | |
| 9,184,735 B1 | 11/2015 | Chen et al. | |
| 2004/0075468 A1 | 4/2004 | Haskin | |
| 2004/0110480 A1 | 6/2004 | Haskin | |

(Continued)

FOREIGN PATENT DOCUMENTS

| | | | |
|---|---|---|---|
| EP | 0450406 A2 | 10/1991 | |
| EP | 1742364 A2 | 1/2007 | |

(Continued)

OTHER PUBLICATIONS

International Search Report and Written Opinion—PCT/US2015/019958—ISA/EPO—Oct. 14, 2015.

(Continued)

*Primary Examiner* — William Hernandez
(74) *Attorney, Agent, or Firm* — Haynes and Boone, LLP (36340)

(57) ABSTRACT

An input receiver for stepping down a high power domain input signal for a high power domain powered by a high power supply voltage into an output signal for a low power domain includes a waveform splitter. The waveform splitter splits the high power domain input signal into a high voltage signal and a low voltage signal. A high voltage input receiver receives the high voltage signal to produce a received high voltage that is level shifted into a first input signal. A low voltage input receiver receives the low voltage signal to produce a second input signal. A logic circuit generates the output signal from the first input signal and the second input signal.

27 Claims, 6 Drawing Sheets

(56) References Cited

U.S. PATENT DOCUMENTS

| | | | |
|---|---|---|---|
| 2007/0176668 | A1 | 8/2007 | Kimura |
| 2009/0261865 | A1* | 10/2009 | Pasqualini ....... H03K 19/00315 |
| | | | 327/108 |
| 2012/0194254 | A1 | 8/2012 | Srivastava et al. |
| 2013/0293278 | A1* | 11/2013 | Larsen ...................... H03L 5/00 |
| | | | 327/333 |
| 2015/0303906 | A1 | 10/2015 | Chen et al. |
| 2016/0105183 | A1* | 4/2016 | Kim ....................... H03K 3/356 |
| | | | 327/333 |
| 2017/0041002 | A1* | 2/2017 | Dey ............... H03K 19/017509 |

FOREIGN PATENT DOCUMENTS

| | | |
|---|---|---|
| JP | S55165006 A | 12/1980 |
| JP | H08265065 A | 10/1996 |

OTHER PUBLICATIONS

Partial International Search Report—PCT/US2015/019958—ISA/EPO—Jun. 29, 2015.
International Search Report and Written Opinion—PCT/US2017/018751—ISA/EPO—Jun. 1, 2017.

* cited by examiner

HIGH VOLTAGE INPUT RECEIVER USING LOW-VOLTAGE DEVICES

TECHNICAL FIELD

This application relates to receivers, and more particularly for a receiver that converts a high-voltage-domain input signal into a received low-voltage-domain signal.

BACKGROUND

As semiconductor technology has advanced into the deep submicron regime, the core power supply voltage is scaled down in concert with the scaling of the core power domain transistor dimensions. Similarly, an input/output (I/O) power supply voltage for I/O power domains has also been scaled down. Nevertheless, input/output (I/O) standards from higher-voltage I/O power domains may still need to be supported. An integrated circuit may thus need an input receiver that can receive input signals from a first I/O power domain to produce corresponding core power domain output signals or second I/O power domain output signals. A first I/O power supply voltage for the first I/O power domain is typically significantly higher than a second I/O power supply voltage for the second I/O power domain or a core power supply voltage for the core power domain. Given the disparity between various power supply voltages, devices in the input receiver are stressed and may malfunction if the voltage difference across their terminals (gate to source, gate to drain, or drain to source) exceeds the power supply voltage for their particular power domain. The following discussion will designate the high supply voltage for the high power domain as VDDPX and designate the low power supply voltage for the low power domain as VDDIX.

Given the need for low power domain devices to accommodate the reception of high power domain input signals, a variety of low power domain input receiver architectures have been developed. For example, it is conventional to use a native low power domain pass transistor to pass input signals from the high power domain. In such receivers, the native pass transistor has its gate biased by the low power supply voltage. Thus, even though a terminal such as the drain of the native pass transistor is exposed to the high power supply voltage, the gate-to-drain voltage difference for the native pass transistor does not exceed the power supply voltage difference VDDPX-VDDIX such that the native pass transistor is not stressed despite its exposure to the high power supply voltage.

Given its zero threshold voltage, the native pass transistor passes the high power domain input signal as a low power domain input signal that cycles between ground and the low power supply voltage. However, the usage of native pass transistors suffers from a number of problems. For example, an external source drives the high power domain input signal. A input receiver designer may thus have no control over the quality of the high power domain input signal. Given this lack of control, the native pass transistor is forced to pass whatever duty cycle and slew rate it receives through to the remainder of the input receiver. The duty cycle and slew rate for the low power domain input signal passed by the native pass transistor may thus be unacceptably distorted. More fundamentally, native devices are no longer available at deep submicron process nodes. Various receiver architectures have thus been developed using non-native low power domain devices. However, these non-native receivers are subjected to the same duty cycle and slew rate distortion issues that native pass transistor approaches suffer from. In addition, the non-native devices are strained by excessively fast slew rates and also excessively slow slew rates for the high power domain input signal.

An example non-native input receiver 100 is shown in FIG. 1. In this embodiment, the high power supply voltage is 3.6V whereas the low power supply voltage is 1.8V. Thus, a high power domain input signal 102 received at an input pad 105 cycles between 0V and 3.6V. A waveform splitter 110 splits high power domain input signal 102 into an upper-half signal 125 and a lower-half signal 130. Upper-half signal 125 cycles between 1.8V and 3.6V whereas lower-half signal 130 cycles between 0V and 1.8V. A single 3.6V input receiver 115 combines upper-half signal 125 and lower-half signal 130 to produce a combined signal 140 that cycles between 0V and 3.6V. A voltage translator or step down circuit 120 translates combined signal 140 into a low power domain output signal 135 that cycles between 0V and 1.8V.

Since 3.6V input receiver 115 has to support a 3.6 volt swing in combined signal 140, it will generally require some form of gate coupling from input pad 105 to provide sufficient overdrive voltage to its devices. The slew rate for high power domain input signal 102 must thus be confined to a relatively narrow range to keep the devices in 3.6V input receiver 115 within their reliability range. Moreover, since 3.6V input receiver 115 has just a single intermediate power supply voltage of 1.8V, providing sufficient hysteresis between the processing of upper-half signal 125 and lower-half signal 130 is problematic.

Accordingly, there is a need in the art for more robust input receivers for receiving high power domain input signals using non-native low power devices.

SUMMARY

An input receiver is provided that includes a waveform splitter for splitting a high power domain input signal that cycles between ground and a high power supply voltage for the high power domain. The waveform splitter is configured to split the high power domain input signal with regard to a low power supply voltage for a low power domain including the input receiver. The high power supply voltage is greater than the low power supply voltage. The waveform splitter splits the high power domain input signal into a high voltage signal that cycles between the low power supply voltage and the high power supply voltage and into a low voltage signal that cycles between ground and the low power supply voltage. If the low power supply voltage equals one-half of the high power supply voltage, the high voltage signal substantially equals the upper-half of the high power domain input signal whereas the low voltage signal substantially equals the lower-half of the high power domain input signal.

The input receiver includes a high voltage input receiver that compares the high voltage signal to a high threshold voltage that is greater than the low power supply voltage and less than the high supply voltage to produce a received high voltage signal that cycles between the high power supply voltage and the low power supply voltage. A level shifter circuit level shifts the received high voltage signal by the low power supply voltage to produce a first input signal for the low power domain that cycles between ground and the low power supply voltage. The input receiver also includes a low voltage input receiver that compares the low voltage signal to a low threshold voltage that is greater than ground and less than the low power supply voltage to produce a second input signal for the low power domain that cycles between ground and the low power supply voltage.

A logic circuit compares the binary states of the first and second input signals for the low power domain to determine a binary state of an output signal for the low power domain produced by the input receiver. If both the first input signal and the second input signal have a binary high state, the logic circuit charges the output signal to the low power supply voltage (asserts the output signal to a binary one state). Conversely, the logic circuit discharges the output signal to ground (a binary zero state) when both the first input signal and the second input signal for the low power domain have a binary low state.

The resulting production of the output signal by the logic circuit has robust hysteresis due to the separation between the high threshold voltage and the low threshold voltage. Moreover, the high voltage input receiver controls the slew rate and voltage states of the received high voltage signal, which in turn controls the slew rate and voltage states for the first input signal. Similarly, the low voltage input receiver control the slew rate and voltage states of the second input signal. Thus, the high power domain input signal may have a varying slew rate without endangering the low power domain devices used to implement the input receiver. These advantageous properties may be better appreciated with regard to the following detailed description.

BRIEF DESCRIPTION OF THE DRAWINGS

Embodiments of the disclosed input receiver and their advantages are best understood by referring to the detailed description that follows. It should be appreciated that like reference numerals are used to identify like elements illustrated in one or more of the figures.

DETAILED DESCRIPTION

Figure 1:
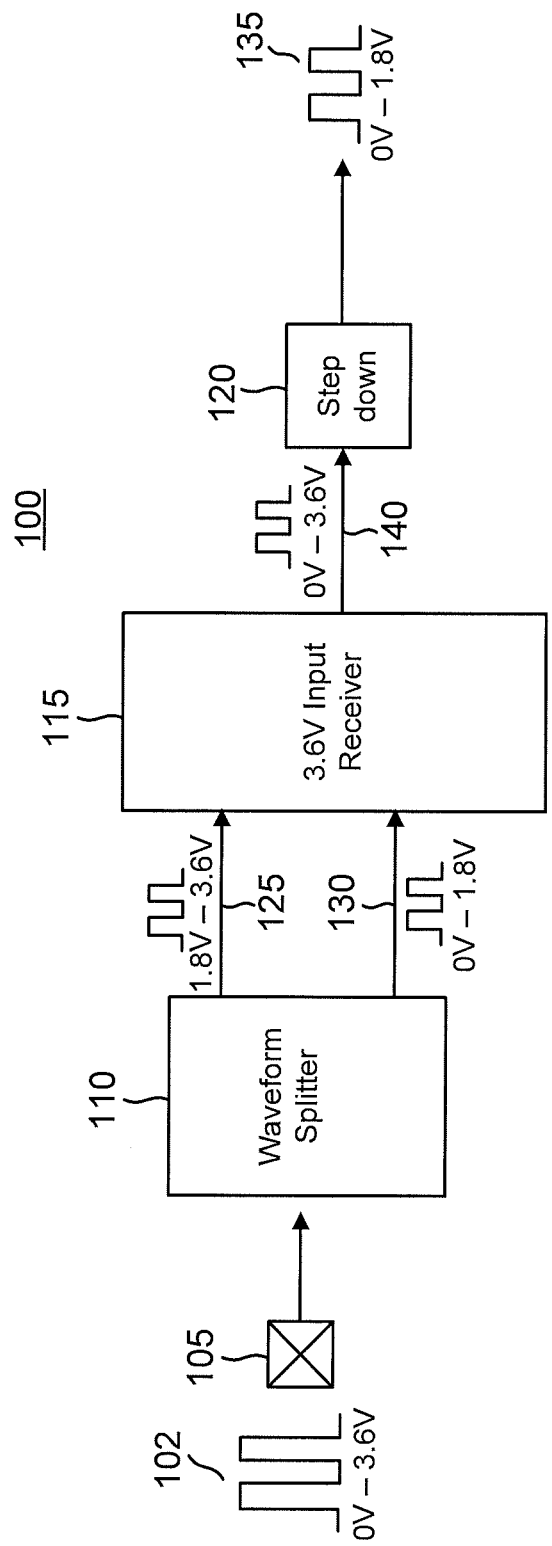
FIG. 1 is a block diagram of an input receiver for converting a high power domain input signal into a low-power-domain output signal using a common input receiver.

An input receiver is provided that converts an high power domain input signal into an output signal for a low power domain without requiring the high power domain input signal to be confined to a relatively narrow slew rate range. The following discussion will be directed to an embodiment in which a high power supply voltage for the high power domain is twice as high as a low power supply voltage for the low power domain. In such an embodiment, a waveform splitter in the input receiver that splits the high power domain input signal with regard to the low power supply voltage produces an upper-half signal (denoted herein as a PADSIG_P signal) and a lower-half signal (denoted herein as a PADSIG_N signal). However, it will be appreciated that the input receiver architectures discussed herein may also be applied to systems in which the low power supply voltage is less than or greater than one-half of the high power supply voltage.

The following discussion will also be directed to an embodiment in which the high power domain is a first I/O power domain whereas the low power domain is a second I/O power domain. But it will be appreciated that the low power domain may be a core power domain instead of an I/O power domain. The first I/O power domain will be denoted in the following discussion as a high power domain having a high power supply voltage VDDPX. The second I/O power domain will be denoted as a low power domain having a low power supply voltage VDDIX. A splitting of a high power domain input signal from the high power domain with regard to the low power supply voltage results in the PADSIG_P signal cycling between the low power supply voltage and the high power supply voltage. Similarly, the PADSIG_N signal cycles between ground and the low power supply voltage.

The input receiver includes a high voltage input receiver for receiving the PADSIG_P signal. For example, the high voltage input receiver may comprise a first inverter having VDDPX as its power supply voltage and VDDIX as its "ground." Such an inverter will thus invert the PADSIG_P signal into a received high voltage signal with respect to a threshold voltage that lies between VDDIX and VDDPX. The low voltage input receiver may comprise a grounded second inverter having VDDIX as its power supply voltage. The second inverter will thus invert the PADSIG_N signal into a low power domain input signal (denoted herein as an RX_N input signal) with regard to a threshold voltage that lies between VDDIX and ground. One can thus immediately appreciate the robust hysteresis that is provided by the use of such separate threshold voltages in the high voltage and low voltage input receivers.

Because the slew rate and voltage states for the received high voltage signal are controlled by the high voltage input receiver, the design of a level shifter circuit that level shifts the received high voltage signal into a level-shifted low power domain input signal (denoted herein as an RX_P input signal) is relaxed. In that regard, any suitable conventional level-shifter circuit that uses low power domain devices to level shift the received high voltage signal by VDDIX may be used. Accordingly, the design of the level-shifter circuit is not discussed further herein as its design would be evident to one of ordinary skill in the level-shifting arts.

A logic circuit compares the binary states of the RX_P and RX_N input signals to determine a binary state of a low power domain output signal produced by the input receiver. The binary state of the RX_P and RX_N input signals may be determined using either an active high or active low basis. The following discussion will assume that the logic circuit is an active-high logic circuit such that either of the RX_P and RX_N input signals is deemed to have a binary one state (logic one binary value) when the input signal is above some threshold voltage that is greater than ground and less than or equal to the low power supply voltage. Similarly, either of the RX_P and RX_N input signals is deemed to have a binary zero state (logic 0 binary value) when the input signal is less than the threshold voltage. It will be appreciated, however, that the logic circuit may also be implemented as an active-low logic circuit in which the binary values are reversed. Regardless of whether the logic circuit is active high or low, it drives the low power domain output signal to a binary one state responsive to both the RX_P and RX_N input signals having a binary one state. Similarly, the logic circuit drives the low power domain output signal to a binary zero state responsive to both the RX_P and RX_N input signal having a binary zero state.

In an active high embodiment, note that as the high power domain input signal rises from ground to VDDPX, the RX_N input signal will first be asserted to a binary one value as the high power domain input signal rises above the low threshold voltage used by the low voltage input receiver. But the RX_P input signal will still have a binary zero state until the high power domain input signal rises above the high threshold voltage used by the high voltage input receiver. Similarly, the RX_P input signal will change to a binary zero state prior to the RX_N input signal changing to a binary zero state during a falling edge for the high power domain input signal. The logic circuit is thus configured to maintain the current state for the low power domain input signal during the periods when the RX_P input signal has a binary zero value and the RX_N input signal has a binary one value. Some example embodiment will now be discussed in more detail.

Figure 2:
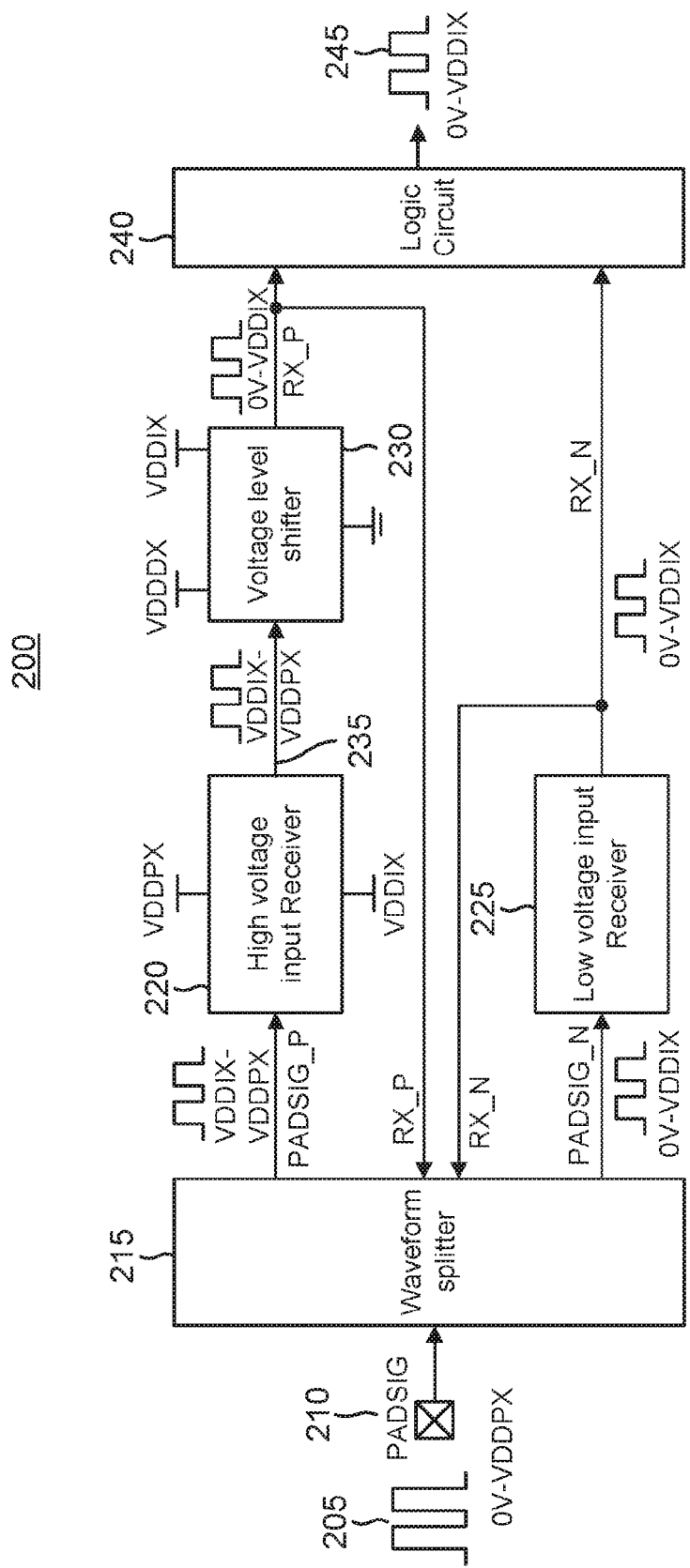
FIG. 2 is a block diagram of an input receiver for converting an high power domain input signal into a low power domain output signal using a high voltage input receiver and a low voltage input receiver in accordance with an aspect of the disclosure.

An example input receiver 200 is shown in FIG. 2. A high power domain input signal 205 that cycles between ground (0V) and VDDPX is received on an input terminal (PADSIG) 210 for a waveform splitter 215. Waveform splitter 215 splits high power domain input signal 205 into an upper-half input signal (PADSIG_P) and a lower-half input signal (PADSIG_N) with regard to VDDIX. The PADSIG_P input signal from waveform splitter 215 thus cycles between VDDIX and VDDPX. Conversely, the PADSIG_N input signal from waveform splitter 215 cycles between ground and VDDIX.

A high voltage input receiver 220 compares the PADSIG_P input signal to a high threshold voltage that is greater than VDDIX and less than VDDPX to produce a received high voltage signal 235. Like the PADSIG_P input signal (the high voltage signal), received high voltage signal 235 cycles between VDDIX and VDDPX. But the slew rate of received high voltage signal 235 is controlled by high voltage input receiver 220. This slew rate control by high voltage input receiver 220 protects the low power domain transistors (not illustrated) in a voltage level shifter circuit 230 from being stressed by an excessively slow or fast slew rate for high power domain input signal 205. In that regard, all the components discussed herein with regard to input receiver 200 are constructed with low power domain transistors. But the advantageous properties of input receiver 200 protect these low power domain devices from voltage stress. Voltage level shifter 230 uses both the VDDPX and VDDIX power supply voltages to level shift received high voltage signal 235 by VDDIX into a low power domain first input signal denoted herein as an RX_P input signal.

A low voltage input receiver 225 compares the PADSIG_N input signal (the low voltage signal) to a low threshold voltage that is greater than 0V and less then VDDIX to produce a low power domain second input signal denoted herein as an RX_N input signal. A logic circuit 240 compares the binary states of the RX_P and RX_N input signals as discussed above to produce a low power domain output signal 245 that cycles between 0V and VDDIX. Although low power domain output signal 245 is an output signal with regard to input receiver 200, it would be received as an input signal by other components (not illustrated) in the low power domain. For example, low power domain output signal 245 may be received by a processor or other suitable low power domain component.

Figure 3:
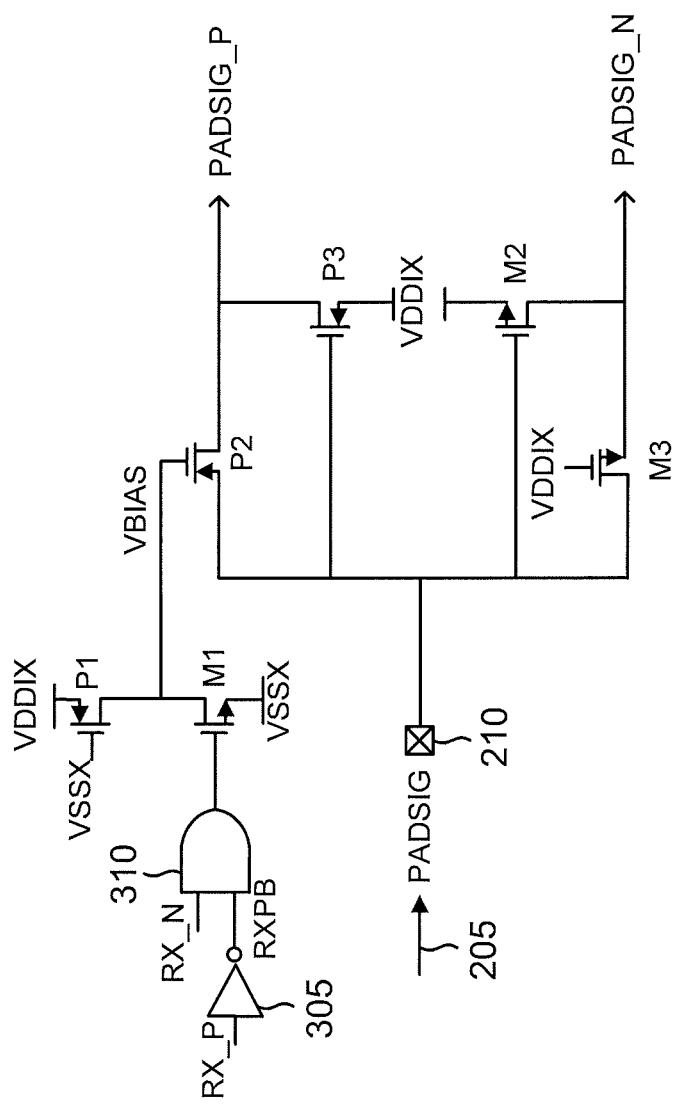
FIG. 3 is a circuit diagram of the waveform splitter in the input receiver of FIG. 2 in accordance with an aspect of the disclosure.

Waveform splitter 215 is shown in more detail in FIG. 3. An NMOS pass transistor M3 has its gate biased by VDDIX and its drain tied to PADSIG input pad 210. High power domain input signal 205 will thus pass through pass transistor M3 as high power domain input signal 205 rises from 0V. An NMOS clamping transistor M2 also has its gate tied to PADSIG input pad 210. A source for clamping transistor M2 couples to the source for pass transistor M3 for producing the PADSIG_N input signal. The drain for clamping transistor M2 couples to a low power supply node supplying VDDIX. As high power domain input signal 205 rises above VDDIX, clamping transistor M2 thus clamps the PADSIG_N input signal at VDDIX. In this fashion, the PADSIG_N input signal represents the bottom half of high power domain input signal 205 such that the PADSIG_N input signal substantially equals high power domain input signal 205 when high power domain input signal 205 is less than or equal to VDDIX and such that the PADSIG_N input signal is clamped at VDDIX when high power domain input signal 205 is greater than VDDIX.

A PMOS pass transistor P2 for producing the PADSIG_P signal has its source coupled to PADSIG input pad 210 and its drain coupled to a drain of a PMOS clamping transistor P3. The source of clamping transistor P3 is tied to the VDDIX power supply node. Clamping transistor P3 is thus switched on as high power domain input signal 205 drops below VDDIX to clamp the PADSIG_P input signal to VDDIX. The gate of pass transistor P2 could be biased to VDDIX analogously as discussed with regard to pass transistor M3. But the threshold voltage for pass transistor P2 would then introduce duty cycle distortion in the PADSIG_P input signal with regard to the rising edge of high power domain input signal 205. In particular, the PADSIG_P input signal would not begin to rise above VDDIX until high power domain input signal 205 has risen above VDDIX by the threshold voltage for pass transistor P2. To pass more of the rising edge of high power domain input signals 205 as it rises above VDDIX through pass transistor P2, the gate of pass transistor P2 is biased by a bias voltage VBIAS produced at the drain of an NMOS voltage divider transistor M1. The source of voltage divider transistor M1 couples to ground whereas its drain couples to the drain of a PMOS voltage divider transistor P1. The gate of voltage divider transistor P1 is grounded. Since the source of voltage divider transistor P1 is tied to a low power supply node supplying VDDIX, voltage divider transistor P1 is always on and attempting to bias VBIAS to VDDIX.

An AND gate 310 controls the gate voltage for voltage divider transistor M1. If the output of AND gate 310 is a binary zero, voltage divider transistor M1 is off such that voltage divider transistor P1 biases VBIAS to VDDIX. But if the output of AND gate 310 is asserted to VDDIX (a binary one), voltage divider transistor M1 switches on. Voltage divider transistor M1 is smaller than voltage divider transistor P1 such that voltage divider transistor M1 is more resistive than voltage divider transistor P1. The resulting voltage division by voltage divider transistors M1 and P1 thus pulls VBIAS below VDDIX by some fraction of VDDIX when the output of AND gate 310 is asserted high. Since voltage divider transistor M1 is more resistive than voltage divider P1, the fraction of VDDIX is less than one-half of VDDIX. AND gate 310 receives the RX_N input signal and a complement RXPB of the RX_P input signal produced by an inverter 305. The output of AND gate 310 will thus go high when the RX_N input signal has transitioned to a binary one value but the RX_P input signal is still a binary zero. The bias voltage VBIAS will thus be lowered when the PADSIG_N input signal from waveform splitter 215 has passed the low threshold voltage of low voltage input receiver 225 (FIG. 2) but has not passed the high threshold voltage of high voltage input receiver 220 (FIG. 2). In this fashion, a rising edge of high power domain input signal 205 can pass through pass transistor P2 as high power domain input signal 205 rises from VDDIX to forth a corresponding rising edge of the PADSIG_P input signal without suffering from a duty cycle distortion from the threshold voltage for pass transistor P2. In one embodiment, waveform splitter 215 may be deemed to comprise a means for splitting high power domain input signal 205 with regard to the bias voltage VBIAS into the PADSIG_P input signal that is greater than or equal to VDDIX and for splitting high power domain input signal 205 with regard to VDDIX into the PADSIG_N input signal that is less than or equal to VDDIX.

Figures 4A, 4B:
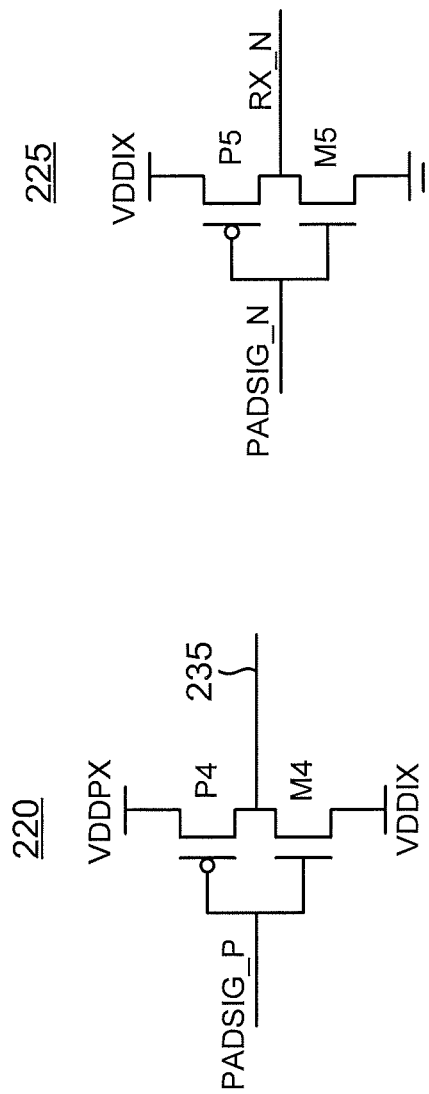
FIG. 4A is a circuit diagram for the high voltage input receiver in the input receiver of FIG. 2 in accordance with an aspect of the disclosure.
FIG. 4B is a circuit diagram for the low voltage input receiver in the input receiver of FIG. 2 in accordance with an aspect of the disclosure.

Referring again to FIG. 2, high voltage input receiver 220 and low voltage input receiver 225 may both be implemented using inverters. However, it will be appreciated that other suitable receivers such as a Schmitt trigger may be used to form high voltage input receiver 220 and low voltage input receiver 225. The following discussion will thus assume without loss of generality that receivers 220 and 225 are each formed using an inverter. A circuit diagram for high voltage input receiver 220 is shown in FIG. 4A. The PADSIG_P input signal from waveform splitter 215 (FIGS. 2 and 3) drives a gate of a PMOS transistor P4 and an NMOS transistor M4. The source of NMOS transistor M4 is coupled to a low power supply node supplying VDDIX and its drain is coupled to a drain of transistor P4. The source of transistor P4 is tied to an high power supply node supplying VDDPX. Received high voltage signal 235 is produced at the drains of transistors P4 and M4. The high threshold voltage for high voltage input receiver 220 will thus depend upon the relative strengths of transistors P4 and M4. Assuming equal strengths for these transistors, the high threshold voltage will thus equal (VDDPX−VDDIX)/2. Low voltage input receiver 225 may be constructed analogously as shown in FIG. 4B. The PADSIG_N input signal from waveform splitter 215 (FIGS. 2 and 3) drives a gate of a PMOS transistor P5 and an NMOS transistor M5. The source of NMOS transistor M5 is coupled to ground and its drain is coupled to a drain of transistor P4. The source of transistor P5 is tied to a low power supply node supplying VDDIX. The RX_N input signal is produced at the drains of transistors P5 and M5. The low threshold voltage for low voltage input receiver 225 will thus depend upon the relative strengths of transistors P5 and M5. Assuming equal strengths for these transistors, the low threshold voltage will thus equal (VDDIX)/2. The high voltage threshold and low voltage threshold may thus be separated by VDDIX in some embodiments to provide a robust hysteresis range.

Figure 5:
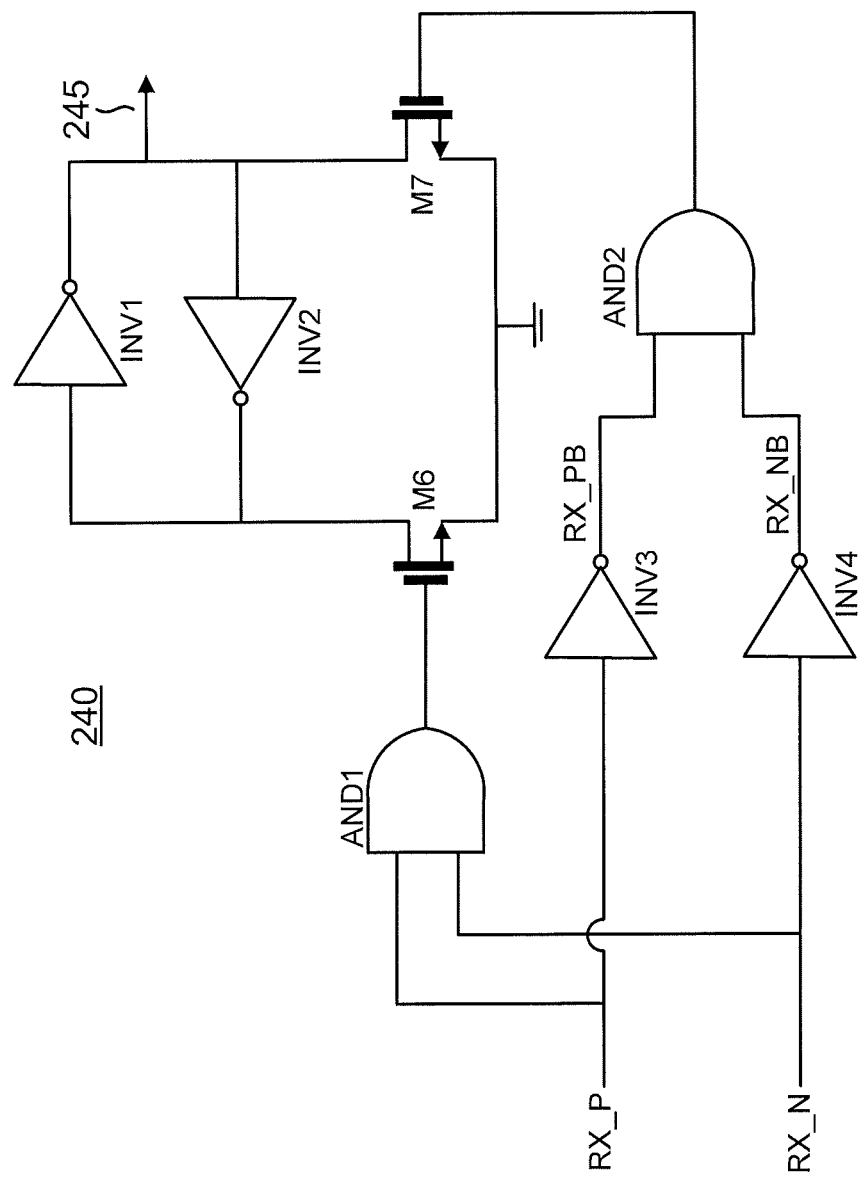
FIG. 5 is a circuit diagram for the logic circuit in the receiver of FIG. 2 in accordance with an aspect of the disclosure.

Logic circuit 240 is shown in more detail in FIG. 5. A current value for low power domain output signal 245 (its current binary state) is latched using a pair of cross-coupled inverters INV1 and INV2. In particular, low power domain output signal 245 is produced by inverter INV1. The binary state of low power domain output signal 245 is controlled by an NMOS pull down transistor M6 and an NMOS pull down transistor M7. Pull down transistor M6 has its drain coupled to the output of inverter INV2 and its source coupled to ground. Similarly, pull down transistor M7 has its drain coupled to the output of inverter INV1. Should pull down transistor M7 be switched on while pull down transistor M6 is switched off, low power domain output signal 245 is grounded. Conversely, low power domain output signal 245 is charged to VDDIX when pull down transistor M7 is switched off and pull down transistor M6 switched on. To control this complementary switching of pull down transistors M6 and M7, logic circuit 240 may include an AND gate AND1 and an AND gate AND2. AND gate AND1 receives the RX_P and RX_N input signals to drive the gate of pull down transistor M6. If both the RX_P and RX_N input signals have transitioned to a binary high state, pull down transistor M6 is switched on to ground the input to inverter INV1 to cause low power domain output signal 245 to be charged to VDDIX. An inverter INV3 inverts the RX_P input signal into an inverted input signal RX_PB. Similarly, an inverter INV4 inverts the RX_N input signal into an inverted input signal RX_NB. AND gate AND2 receives these inverted input signals. Thus, if both the RX_P and RX_N input signals are a binary zero, pull down transistor M7 is switched on to discharge low power domain output signal 245. Note that the remaining binary combinations for the RX_P and RX_N input signals (one being a binary zero, the other being a binary one) do not affect the binary state of low power domain output signal 245. The resulting operation may be summarized in the following table:

| RX_P | RX_N | Output Signal |
| --- | --- | --- |
| 0 | 0 | Receiver will output 0 |
| 0 | 1 | Hold current output state |
| 1 | 0 | Hold current output state (note that this state will not occur in normal operation) |
| 1 | 1 | Receiver will output 1 |

Figure 6:
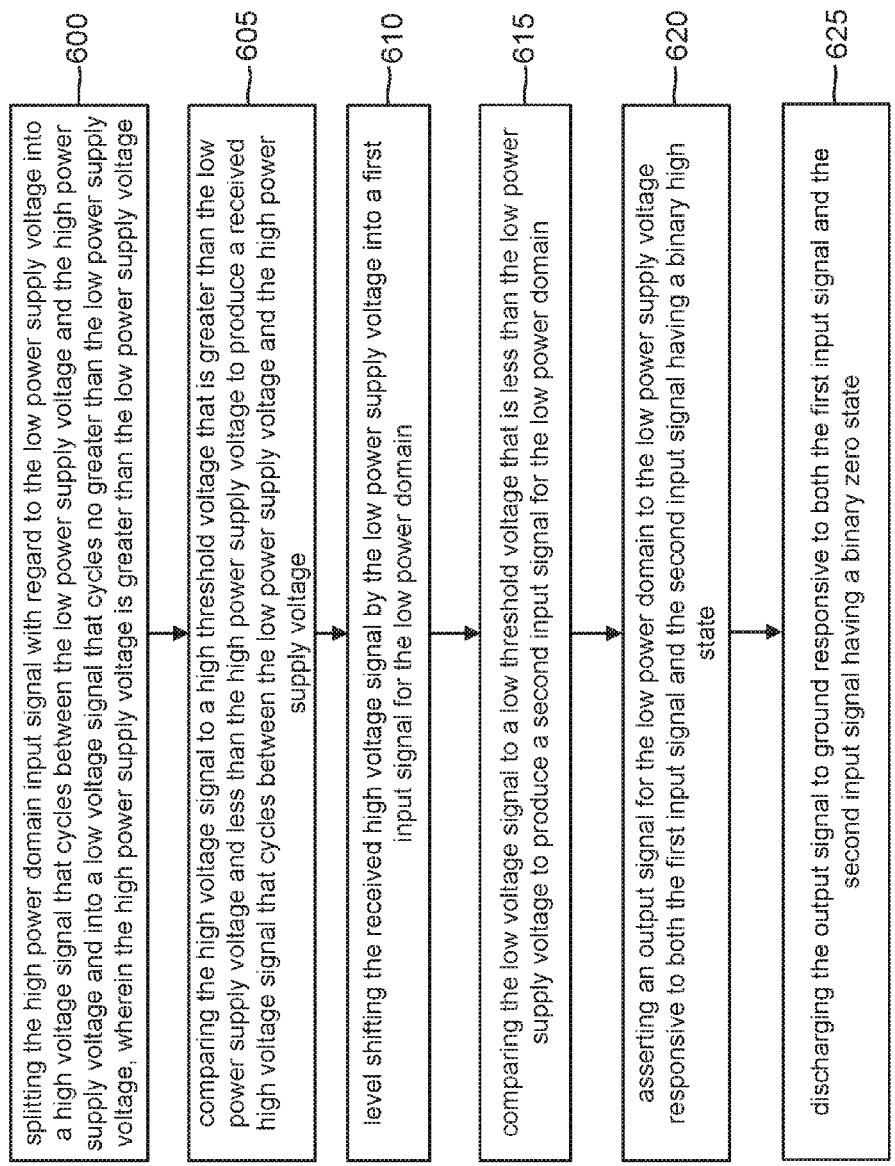
FIG. 6 is a flowchart for an example method of use for the receiver of FIG. 2 in accordance with an aspect of the disclosure.

A method of receiving a high power domain input signal from a high power domain powered by a high power supply voltage to produce an output signal for a low power domain powered by a low power supply voltage will now be discussed with regard to the flowchart shown in FIG. 6. The method includes an act 600 of splitting the high power domain input signal with regard to the low power supply voltage into a high voltage signal that cycles between the high power supply voltage and the low power supply voltage and into a low voltage signal that cycles no greater than the low power supply voltage, wherein the high power supply voltage is greater than the low power supply voltage. The splitting of high power domain input signal 205 into the PADSIG_P input signal is an example of producing the high voltage signal. Similarly, the same splitting into the PADSIG_N input signal is an example of producing the low voltage signal.

The method also includes an act 605 of comparing the high voltage signal to a high threshold voltage that is greater than the low power supply voltage and less than the high power supply voltage to produce a received high voltage signal that cycles between the high power supply voltage and the low power supply voltage. The comparison of the PADSIG_P input signal by high voltage input receiver 220 to a high threshold voltage that approximately equals (VDDPX−VDDIX)/2 to produce received high voltage signal 235 as discussed with regard to FIG. 4A is an example of act 605.

In addition, the method includes an act 610 of level shifting the received high voltage signal by the low power supply voltage into a first input signal for the low power domain. The level shifting of received high voltage signal

235 by VDDIX in level shifter circuit 230 to produce the RX_P input signal as discussed with regard to FIG. 2 is an example of act 610.

The method also includes an act 615 of comparing the low voltage signal to a low threshold voltage that is less than low power supply voltage to produce a second input signal for the low power domain. The comparison of the PADSIG_N input signal by the low voltage input receiver 225 to a low threshold voltage that approximately equals (VDDIX)/2 to produce the RX_N input signal as discussed with regard to FIG. 4B is an example of act 615.

In addition, the method includes an act 620 of asserting an output signal for the low power domain to the low power supply voltage responsive to both the first input signal and the second input signal having a binary high state. The assertion of low power domain output signal 245 to VDDIX by logic circuit 240 in response to the RX_P and RX_N input signals both having a binary one state as discussed with regard to FIG. 5 is an example of act 620.

Finally, the method includes an act 625 of discharging the output signal to ground responsive to both the first input signal and the second input signal having a binary zero state. The discharge of low power domain output signal 245 to ground by logic circuit 240 in response to the RX_P and RX_N input signals both having a binary zero state as discussed with regard to FIG. 5 is an example of act 625.

Those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:
1. A method of receiving a high power domain input signal for a high power domain powered by a high power supply voltage into an output signal for a low power domain powered by a low power supply voltage, comprising:
   splitting the high power domain input signal with regard to the low power supply voltage into a high voltage signal that cycles between the low power supply voltage and the high power supply voltage and into a low voltage signal that cycles no greater than the low power supply voltage, wherein the high power supply voltage is greater than the low power supply voltage;
   comparing the high voltage signal to a high threshold voltage that is greater than the low power supply voltage and less than the high power supply voltage to produce a received high voltage signal that cycles between the low power supply voltage and the high power supply voltage;
   level shifting the received high voltage signal by the low power supply voltage into a first input signal for the low power domain;
   comparing the low voltage signal to a low threshold voltage that is less than the low power supply voltage to produce a second input signal for the low power domain;
   asserting an output signal for the low power domain to the low power supply voltage responsive to both the first input signal and the second input signal having a binary high state; and
   discharging the output signal to ground responsive to both the first input signal and the second input signal having a binary zero state.

2. The method of claim 1, wherein the high power domain is an I/O power domain and the high power supply voltage is an I/O power supply voltage, and wherein the low power domain is a core power domain and the low power supply voltage is a core power supply voltage.

3. The method of claim 1, wherein the high power domain is a first I/O power domain and the high power supply voltage is a first I/O power supply voltage, and wherein the low power domain is a second I/O power domain and the low power supply voltage is a second I/O power supply voltage.

4. The method of claim 1, wherein comparing the high voltage signal to the high threshold voltage to produce the received high voltage signal comprises passing the high voltage signal through an inverter.

5. The method of claim 3, wherein the high threshold voltage substantially equals one half of a difference between the first I/O power supply voltage and the second I/O power supply voltage.

6. The method of claim 1, wherein the low threshold voltage is less than the low power supply voltage and greater than 0 volts.

7. The method of claim 6, wherein comparing the low voltage signal to the low threshold voltage to produce the second input signal comprises passing the low voltage signal through an inverter.

8. The method of claim 6, wherein the low threshold voltage substantially equals one half of the low power supply voltage.

9. The method of claim 1, wherein the low power domain output signal has a current binary value, the method further comprising:
   latching the low power domain output signal at the current binary value responsive to the second input signal having a binary one value and the first input signal having a binary zero value.

10. The method of claim 1, wherein splitting the high power domain input signal into the low voltage signal comprises:
    passing the high power domain input signal through an NMOS pass transistor having its gate biased by the low power supply voltage to produce the low voltage signal; and
    clamping the low voltage signal at the low power supply voltage while the high power domain input signal is greater than the low power supply voltage.

11. The method of claim 1, wherein splitting the high power domain input signal into the high voltage signal comprises:
    generating a bias voltage equal to the low power supply voltage when the first input signal and the second input signal both are in a binary one state;
    lowering the bias voltage from the low power supply voltage responsive to the first input signal being in a binary zero state while the second input signal is in a binary one state;
    passing the high power domain input signal through a PMOS pass transistor having its gate biased by the bias voltage to produce the high voltage signal; and
    clamping the high voltage signal at the low power supply voltage while the high power domain input signal is less than the low power supply voltage.

12. An input receiver for receiving a high power domain input signal from a high power domain powered by a high power supply voltage, wherein the input receiver is within a low power domain powered by a low power supply voltage, comprising:
  a waveform splitter configured to split the high power domain input signal into a high voltage signal that is greater than or equal to the low power supply voltage and into a low voltage signal that is less than or equal to the low power supply voltage, wherein the high power supply voltage is greater than the low power supply voltage;
  a high voltage input receiver configured to compare the high voltage signal to a high voltage threshold that is greater than the low power supply voltage and less than the high power supply voltage to generate a received high voltage signal;
  a level shifter configured to shift the received high voltage signal by the low power supply voltage to produce a first input signal for the low power domain;
  a low voltage input receiver configured to compare the low voltage signal to a low voltage threshold that is less than the low power supply voltage to generate a second input signal for the low power domain; and
  a logic circuit configured to charge an output signal for the low power domain to the low power supply voltage responsive to the first input signal and the second input signal both having a binary one state and configured to discharge the output signal to ground responsive to the first input signal and the second input signal both having a binary zero state.

13. The input receiver of claim 12, wherein the high power domain is an I/O power domain and the high power supply voltage is an I/O power supply voltage, and wherein the low power domain is a core power domain and the low power supply voltage is a core power supply voltage.

14. The input receiver of claim 12, wherein the high power domain is a first I/O power domain and the high power supply voltage is a first I/O power supply voltage, and wherein the low power domain is a second I/O power domain and the low power supply voltage is a second I/O power supply voltage.

15. The input receiver of claim 12, wherein the high voltage input receiver comprises an inverter including a PMOS transistor in series with an NMOS transistor, and wherein a source of the NMOS transistor is coupled to a low power supply node for supplying the low power supply voltage and wherein a source of the PMOS transistor is coupled to a high power supply node for supplying the high power supply voltage.

16. The input receiver of claim 12, wherein the low voltage input receiver comprises an inverter including a PMOS transistor in series with an NMOS transistor, and wherein a source of the NMOS transistor is coupled to ground and wherein a source of the PMOS transistor is coupled to a low power supply node for supplying the low power supply voltage.

17. The input receiver of claim 12, wherein the logic circuit includes a latch for storing a current state of the output signal.

18. The input receiver of claim 17, wherein the latch comprises a first inverter cross-coupled with a second inverter, and wherein the logic circuit further includes a first pull down transistor coupled between an input node to the first inverter and ground and a second pull down transistor coupled between an input node to the second inverter and ground.

19. The input receiver of claim 18, wherein the logic circuit further includes a first AND gate configured to switch on the first pull down transistor to discharge the output signal to ground responsive to a complement of the first input signal and a complement of the second input signal both being in a binary one state.

20. The input receiver of claim 19, wherein the logic circuit further includes a second AND gate configured to switch on the second pull down transistor to charge the output signal to the low power supply voltage responsive to the first input signal and the second input signal both being in a binary one state.

21. The input receiver of claim 12, wherein the waveform splitter comprises;
  a voltage divider for generating a bias voltage;
  a PMOS pass transistor having a gate biased by the bias voltage, the PMOS pass transistor being configured to pass the high power domain input signal as the high voltage signal, wherein the voltage divider is configured to charge the bias voltage to the low power supply voltage responsive to the first input signal and the second input signal both being in a binary one state and to lower the bias voltage from the low power supply voltage responsive to the first input signal being in a binary zero state while the second input signal is in a binary one state.

22. The input receiver of claim 21, wherein the waveform splitter further comprises a clamping transistor configured to clamp the high voltage signal at the low power supply voltage when the high power domain input signal is less than the low power supply voltage.

23. An input receiver for receiving an input/output (I/O) power domain input signal, comprising:
  means for splitting the I/O power domain input signal with regard to a bias voltage into a high voltage signal that is greater than or equal to a core power supply voltage and for splitting the I/O power domain input signal with regard to the core power supply voltage into a low voltage signal that is less than or equal to the core power supply voltage;
  a first inverter configured to invert the high voltage signal with regard to a high threshold voltage to produce a received high voltage signal, wherein the high threshold voltage is less than an I/O power supply voltage and greater than the core power supply voltage;
  a level shifter configured to shift the received high voltage signal by the core power supply voltage to produce a first input signal;
  a second inverter configured to invert the low voltage signal with regard to a low threshold voltage to produce a second input signal, wherein the low threshold voltage is less than the core power supply voltage and greater than ground; and
  a logic circuit configured to charge an output signal to the core power supply voltage responsive to the first input signal and the second input signal both being in a binary one state and configured to discharge the output signal to ground responsive to the first input signal and the second input signal both being in a binary zero state, wherein the means is configured to charge the bias voltage to the core power supply voltage responsive to the first input signal and the second input signal being in a binary one state and configured to lower the bias voltage from the core power supply responsive to the first input signal being in a binary zero state while the second input signal is in a binary one state.

24. The input receiver of claim 23, wherein the logic circuit includes a latch for storing a current binary state of the output signal.

25. The input receiver of claim 24, wherein the latch comprises a first inverter cross-coupled with a second inverter, and wherein the logic circuit further includes a first pull down transistor coupled between an input to the first inverter and ground and a second pull down transistor coupled between an input to the second inverter and ground.

26. The input receiver of claim 25, wherein the logic circuit further includes a first AND gate configured to switch on the first pull down transistor to discharge the output signal to ground responsive to a complement of the first input signal and a complement of the second input signal both having a binary one state.

27. The input receiver of claim 26, wherein the logic circuit further includes a second AND gate configured to switch on the second pull down transistor to charge the output signal to the core power supply voltage responsive to the first input signal and the second input signal both having a binary one state.

* * * * *